(12) United States Patent
Hiroki et al.

(10) Patent No.: US 9,735,209 B2
(45) Date of Patent: Aug. 15, 2017

(54) LIGHT-EMITTING MODULE, LIGHT-EMITTING PANEL, AND LIGHTING DEVICE

(71) Applicant: Semiconductor Energy Laboratory Co., Ltd., Kanagawa-ken (JP)

(72) Inventors: Masaaki Hiroki, Kanagawa (JP); Satoshi Seo, Kanagawa (JP); Yasuo Nakamura, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/713,803

(22) Filed: May 15, 2015

(65) Prior Publication Data

US 2015/0249116 A1   Sep. 3, 2015

Related U.S. Application Data

(63) Continuation of application No. 13/371,690, filed on Feb. 13, 2012, now Pat. No. 9,035,337.

(30) Foreign Application Priority Data

Feb. 14, 2011   (JP) ................................. 2011-028914

(51) Int. Cl.
*H01L 33/00* (2010.01)
*H01L 27/32* (2006.01)
(Continued)

(52) U.S. Cl.
CPC ...... *H01L 27/3225* (2013.01); *H01L 27/3202* (2013.01); *H01L 27/3204* (2013.01);
(Continued)

(58) Field of Classification Search
CPC ............ H01L 27/3225; H01L 51/5012; H01L 51/5206; H01L 51/529; H01L 51/5221;
(Continued)

(56) References Cited

U.S. PATENT DOCUMENTS 4,537,068 A * 8/1985 Wrobel .................... G01P 5/12
73/204.15
5,384,516 A   1/1995 Kawabata et al.
(Continued)

FOREIGN PATENT DOCUMENTS

JP   2000-277305 A   10/2000
JP   2001-118676 A   4/2001
(Continued)

*Primary Examiner* — Su C Kim
(74) *Attorney, Agent, or Firm* — Husch Blackwell LLP

(57) ABSTRACT

An object is to provide a light-emitting module in which a light-emitting element suffering a short-circuit failure does not cause wasteful electric power consumption. Another object is to provide a light-emitting panel in which a light-emitting element suffering a short-circuit failure does not allow the reliability of an adjacent light-emitting element to lower. Focusing on heat generated by a light-emitting element suffering a short-circuit failure, provided is a structure in which electric power is supplied to a light-emitting element through a positive temperature coefficient thermistor (PTC thermistor) thermally coupled with the light-emitting element.

16 Claims, 9 Drawing Sheets

(51) Int. Cl.
    *H01L 51/50*     (2006.01)
    *H01L 33/64*     (2010.01)
    *H01L 51/52*     (2006.01)

(52) U.S. Cl.
    CPC ...... *H01L 51/5012* (2013.01); *H01L 51/5206* (2013.01); *H01L 51/529* (2013.01); *H01L 51/5221* (2013.01); *H01L 33/64* (2013.01); *H01L 33/645* (2013.01); *H01L 33/647* (2013.01); *H01L 51/5278* (2013.01); *H01L 2251/5361* (2013.01); *H01L 2251/5392* (2013.01); *H01L 2251/556* (2013.01)

(58) Field of Classification Search
    CPC ............ H01L 27/3202; H01L 27/3204; H01L 2251/556; H01L 2251/5361; H01L 51/5278; H01L 2251/5392; H01L 33/64; H01L 33/645; H01L 33/647
    See application file for complete search history.

(56) References Cited

U.S. PATENT DOCUMENTS

| | | | |
|---|---|---|---|
| 5,793,276 A | | 8/1998 | Tosaka et al. |
| 5,838,451 A | * | 11/1998 | McCarthy ............. G01J 3/2803 356/402 |
| 6,323,597 B1 | | 11/2001 | Janning |
| 7,999,463 B2 | | 8/2011 | Nomura |
| 8,070,324 B2 | | 12/2011 | Kornitz et al. |
| 8,519,614 B2 | | 8/2013 | Hiroki et al. |
| 9,035,337 B2 | * | 5/2015 | Hiroki ................. H01L 27/3202 257/407 |
| 2004/0124432 A1 | * | 7/2004 | Ko ..................... H01L 51/5281 257/99 |
| 2005/0012698 A1 | | 1/2005 | Takahashi |
| 2005/0116620 A1 | | 6/2005 | Kobayashi |
| 2008/0083929 A1 | * | 4/2008 | Fan ......................... H01L 27/15 257/79 |
| 2008/0309448 A1 | * | 12/2008 | Itoh ..................... C04B 35/4682 338/22 R |
| 2010/0060175 A1 | | 3/2010 | Lethellier |
| 2010/0244725 A1 | * | 9/2010 | Adamovich ........ H01L 51/5016 315/291 |
| 2011/0018434 A1 | | 1/2011 | Miyaguchi |
| 2011/0057920 A1 | | 3/2011 | Matsuura et al. |
| 2011/0164655 A1 | | 7/2011 | Nawai |
| 2011/0285324 A1 | * | 11/2011 | Kao ................... H05B 33/0809 315/309 |
| 2012/0032182 A1 | * | 2/2012 | Sills ................... H01L 25/0753 257/76 |
| 2012/0061070 A1 | | 3/2012 | Kornitz et al. |
| 2012/0091923 A1 | | 4/2012 | Kastner-Jung et al. |

FOREIGN PATENT DOCUMENTS

| | | |
|---|---|---|
| JP | 2002-204018 A | 7/2002 |
| JP | 2004-342557 A | 12/2004 |
| JP | 2006-108651 A | 4/2006 |
| JP | 2006-269284 A | 10/2006 |
| JP | 2009-021073 A | 1/2009 |
| JP | 2010-272788 A | 12/2010 |
| JP | 2010-282775 A | 12/2010 |
| JP | 2011-529627 | 12/2011 |
| WO | WO 2008/117351 A1 | 10/2008 |
| WO | WO 2010/012084 A1 | 2/2010 |

* cited by examiner

LIGHT-EMITTING MODULE, LIGHT-EMITTING PANEL, AND LIGHTING DEVICE

This application is a continuation of copending U.S. application Ser. No. 13/371,690, filed on Feb. 13, 2012 which is incorporated herein by reference.

BACKGROUND OF THE INVENTION

1. Field of the Invention

The present invention relates to a light-emitting module, a light-emitting panel including a plurality of light-emitting modules, and a lighting device using the light-emitting module. In particular, the invention relates to a light-emitting module including a light-emitting element with a planar light-emitting region, a light-emitting panel including a plurality of the light-emitting modules, and a lighting device using the light-emitting module.

2. Description of the Related Art

Light-emitting elements, in which a layer that includes a light-emitting organic compound and spreads as a film (also referred to as EL layer) is provided between a pair of electrodes, have been known. Such light-emitting elements are called organic EL elements, for example, and light emission can be obtained from the light-emitting organic compound upon application of a voltage between the pair of electrodes. In addition, examples of light-emitting devices using organic EL elements are display devices, planar lighting devices, and the like. Note that in such a display device, an organic EL element is formed over an active matrix substrate.

For example, Patent Document 1 discloses a lighting device using an organic EL element.

REFERENCE

Patent Document 1: Japanese Published Patent Application No. 2006-108651

SUMMARY OF THE INVENTION

Incidentally, there has been a problem in that a short-circuit failure could easily be caused by entry of an extraneous substance between a pair of electrodes because the thickness of an EL layer is as thin as several tens of nanometers to several hundreds of nanometers. Note that in this specification, the term "short-circuit failure" is not limited to the failure in the case where a pair of electrodes short-circuit regardless of voltage application and also includes the failure in the case where a pair of electrodes short-circuit as a result of voltage application (e.g., as a result of current concentration in a portion in which an EL layer is locally thin).

A short circuit between the pair of electrodes of an organic EL element causes the organic EL element not only to cease lighting but also to generate heat, which results in wasteful electric power consumption. Further, when another organic EL element is provided to be adjacent to the short-circuiting organic EL element, the adjacent organic EL element might break down or deteriorate due to the heat generated by the short-circuiting organic EL element.

Further, a short circuit in an organic EL element connected to a constant-voltage power source in particular might not only cease lighting of the organic EL element but also cause a fire. This is because a great amount of current is supplied from the constant-voltage power source to the organic EL element whose electric resistance is reduced by the short circuit.

The present invention is made in view of the foregoing technical background. Therefore, an object of one embodiment of the present invention is to provide a light-emitting module in which a light-emitting element suffering a short-circuit failure does not cause wasteful electric power consumption. Another object of one embodiment of the present invention is to provide a light-emitting panel in which a light-emitting element suffering a short-circuit failure does not allow the reliability of an adjacent light-emitting element to lower.

Another object of one embodiment of the present invention is to provide a lighting device in which a light-emitting element suffering a short-circuit failure does not cause wasteful electric power consumption. Another object of one embodiment of the present invention is to provide a lighting device in which a light-emitting element suffering a short-circuit failure does not allow the reliability to lower.

To achieve any of the above objects, the present invention focuses on heat generated by a light-emitting element including a short-circuit failure. The present invention reaches an idea of a structure in which electric power is supplied to a light-emitting element through a positive temperature coefficient thermistor (PTC thermistor) thermally coupled with the light-emitting element, leading to the solution of the above problems.

Specifically, one embodiment of the present invention is a light-emitting module including the following: a light-emitting element including a layer that includes a light-emitting organic compound between a pair of electrodes; and a positive temperature coefficient thermistor thermally coupled with the light-emitting element. In the light-emitting module, electric power is supplied to the light-emitting element through the positive temperature coefficient thermistor.

The light-emitting module in accordance with any of the above embodiments of the present invention has a structure in which electric power supply to the light-emitting element is through the positive temperature coefficient thermistor thermally coupled with the light-emitting element. Because of this structure, heat generated when a short-circuit failure of the light-emitting element occurs can be detected by the positive temperature coefficient thermistor, and the electric power supply to the light-emitting element can be interrupted or inhibited. Thus, it is possible to provide a light-emitting module in which a light-emitting element suffering a short-circuit failure does not cause wasteful electric power consumption.

Another embodiment of the present invention is a light-emitting module including the following: a light-emitting element including a layer that includes a light-emitting organic compound between a pair of electrodes; and a positive temperature coefficient thermistor thermally coupled with the light-emitting element. In the light-emitting module, electric power is supplied to the light-emitting element through the positive temperature coefficient thermistor, one of the pair of electrodes transmits light emitted by the layer including the light-emitting organic compound, and the positive temperature coefficient thermistor is provided on the side of the other of the pair of electrodes to overlap with the light-emitting element.

The light-emitting module in accordance with any of the above embodiments of the present invention has a structure in which electric power supply to the light-emitting element is through the positive temperature coefficient thermistor thermally coupled with the light-emitting element and the light-emitting element includes an electrode that transmits light emitted by the layer including the light-emitting organic compound as one of the pair of electrodes, and which includes the positive temperature coefficient thermistor on the side of the other of the pair of electrodes. Because of this structure, heat generated when a short-circuit failure of the light-emitting element occurs can be detected by the positive temperature coefficient thermistor, and the electric power supply to the light-emitting element can be interrupted or inhibited. Further, light emission can be extracted through one of the pair of electrodes of the light-emitting element which can transmit light, that is, the electrode toward which the positive temperature coefficient thermistor is not provided. Thus, it is possible to provide a light-emitting module in which a light-emitting element suffering a short-circuit failure does not cause wasteful electric power consumption, or a light-emitting module in which the positive temperature coefficient thermistor does not intercept light emitted by the light-emitting element.

Another embodiment of the present invention is a light-emitting module which has any of the above structures and in which the light-emitting element and the positive temperature coefficient thermistor are thermally coupled through an electrically conductive material.

The light-emitting module in accordance with any of the above embodiments of the present invention has a structure in which electric power supply to the light-emitting element is through the positive temperature coefficient thermistor thermally coupled with the light-emitting element through an electrically conductive material. Because of this structure, the electrically conductive material has both functions of supplying electric power to the light-emitting element and of conducting heat generated by the light-emitting element to the positive temperature coefficient thermistor. Accordingly, without enlargement of the external shape of the light-emitting module, heat generated when a short-circuit failure of the light-emitting element occurs can be detected by the positive temperature coefficient thermistor, and the electric power supply to the light-emitting element can be interrupted or inhibited. Thus, it is possible to provide a light-emitting module in which a light-emitting element suffering a short-circuit failure does not cause wasteful electric power consumption.

Another embodiment of the present invention is a light-emitting module which has any of the above structures and in which electric power is supplied through, instead of the positive temperature coefficient thermistor, a positive temperature coefficient thermistor array in which a plurality of positive temperature coefficient thermistors is connected in series.

The light-emitting module in accordance with any of the above embodiments of the present invention has a structure in which electric power supply to the light-emitting element is through a positive temperature coefficient thermistor array which is thermally coupled with the light-emitting element and in which a plurality of positive temperature coefficient thermistors is connected in series. Because of this structure, while dividing the light-emitting element into a plurality of regions, the plurality of positive temperature coefficient thermistors constituting the positive temperature coefficient thermistor array can detect heat generated when a short-circuit failure of the light-emitting element occurs, and the electric power supply to the light-emitting element can be interrupted or inhibited. Thus, it is possible to provide a light-emitting module in which, even when the short-circuit failure of the light-emitting element is small for its area, the positive temperature coefficient thermistor array does not miss the local heat generation and the light-emitting element causing a short-circuit failure does not cause wasteful electric power consumption.

Another embodiment of the present invention is a light-emitting panel including a plurality of adjacent light-emitting modules having any of the above structures.

The light-emitting panel in accordance with any of the above embodiments of the present invention has a structure including a plurality of adjacent light-emitting modules in each of which electric power is supplied to the light-emitting element through the positive temperature coefficient thermistor thermally coupled with the light-emitting element. Because of this structure, heat generated when a short-circuit failure of the light-emitting element occurs can be detected by the positive temperature coefficient thermistor, and the electric power supply to the light-emitting element can be interrupted or inhibited. Thus, it is possible to provide a light-emitting panel in which a light-emitting element suffering a short-circuit failure does not cause wasteful electric power consumption, or a light-emitting panel in which a light-emitting element suffering a short-circuit failure does not allow the reliability of an adjacent light-emitting element to lower.

Another embodiment of the present invention is a lighting device using any of the above light-emitting modules.

In the lighting device in accordance with any of the above embodiments of the present invention, a light-emitting module having a structure in which electric power supply to the light-emitting element is through the positive temperature coefficient thermistor thermally coupled with the light-emitting element is used. Because of this structure, heat generated when a short-circuit failure of the light-emitting element occurs can be detected by the positive temperature coefficient thermistor, and the electric power supply to the light-emitting element can be interrupted or inhibited. Thus, it is possible to provide a lighting device in which a light-emitting element suffering a short-circuit failure does not cause wasteful electric power consumption.

Note that in this specification, the term "EL layer" refers to a layer provided between a pair of electrodes in a light-emitting element. Therefore, a light-emitting layer including an organic compound that is a light-emitting substance, which is interposed between electrodes, is one mode of an EL layer.

In this specification, the state where two components are thermally coupled refers to the state where two components are located so that heat can be conducted therebetween. Therefore, the state where two components are thermally coupled is not limited to the state where they are in direct contact with each other, and can be the state where a component serving as a heating medium is interposed between the two components.

In accordance with one embodiment of the present invention, it is possible to provide any of the following: a light-emitting module in which a light-emitting element suffering a short-circuit failure does not cause wasteful electric power consumption; a light-emitting panel in which a light-emitting element suffering a short-circuit failure does not allow the reliability of an adjacent light-emitting element to lower; a lighting device in which a light-emitting element suffering a short-circuit failure does not cause wasteful electric power consumption; and a light-emitting module in which a light-emitting element causing a short-circuit failure does not allow the reliability to lower.

DETAILED DESCRIPTION OF THE INVENTION

Figure 1A:
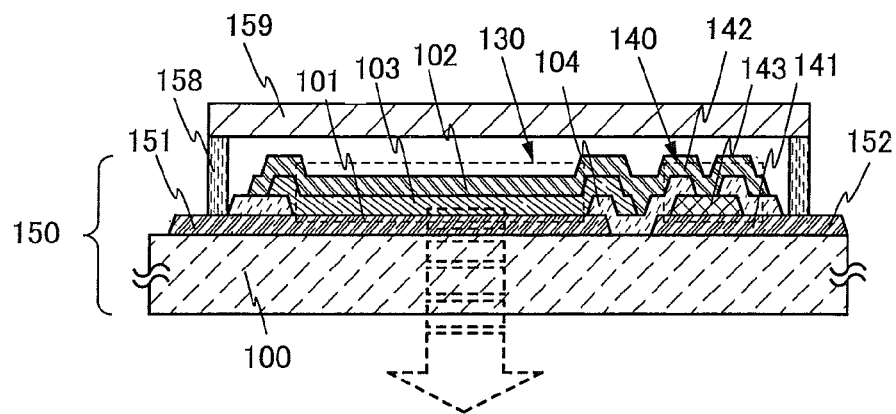
FIGS. 1A to 1C each illustrate a light-emitting module in accordance with one embodiment.

Embodiments will be described in detail with reference to the accompanying drawings. Note that the present invention is not limited to the description given below, and it will be easily understood by those skilled in the art that various changes and modifications can be made without departing from the spirit and scope of the invention. Therefore, the invention should not be construed as being limited to the description in the following embodiments. Note also that in the structures of one embodiment of the present invention described below, the same reference numerals in different drawings represent components that are identical or have similar functions, the description of which is not repeated.
[Embodiment 1]

Figure 1B:
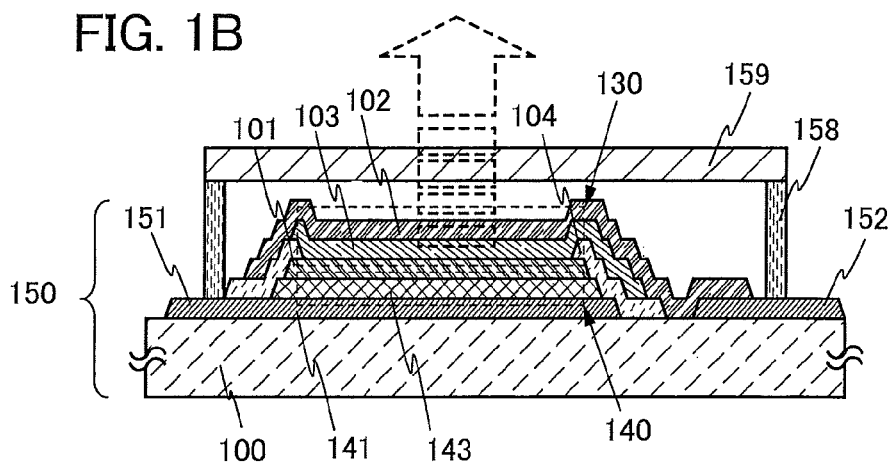
Figure 1C:
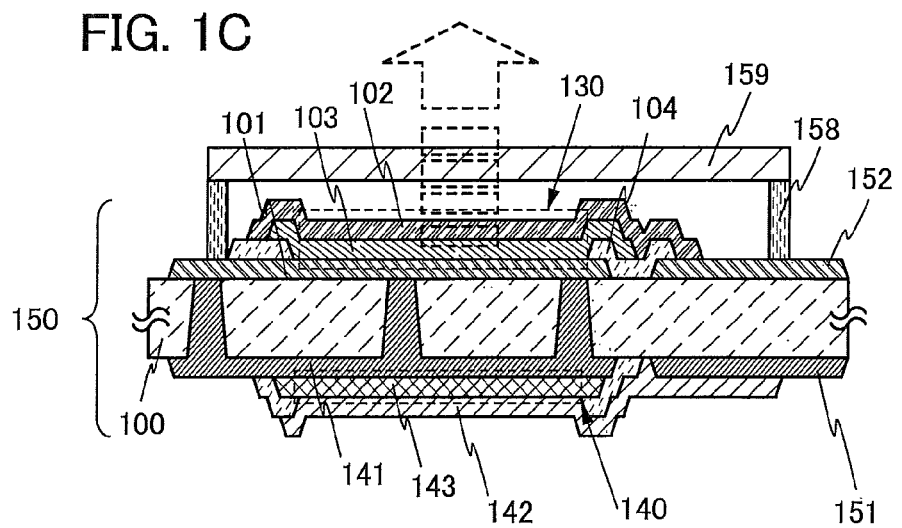

With reference to FIGS. 1A to 1C, this embodiment illustrates a light-emitting module having a structure in which electric power is supplied to a light-emitting element through a positive temperature coefficient thermistor thermally coupled with the light-emitting element, and specifically illustrates a light-emitting module including an organic EL element over a substrate and a positive temperature coefficient thermistor thermally coupled with the organic EL element, in which electric power is supplied to the organic EL element through the positive temperature coefficient thermistor.

A structure of a light-emitting module 150 in accordance with one embodiment of the present invention is illustrated in FIG. 1A. The light-emitting module 150 exemplified in FIG. 1A includes a light-emitting element 130 and a positive temperature coefficient thermistor 140 over a substrate 100. In addition, the light-emitting element 130 is separated from impurities in the air by a sealant 158, a sealing material 159, and the substrate 100 which enclose the light-emitting element 130.

The substrate 100 has a property of transmitting light emitted by the light-emitting element 130. The light-emitting element 130 includes a first electrode 101 in contact with the substrate 100, a partition 104 covering an end portion of the first electrode 101, a second electrode 102 overlapping with the first electrode 101, and a layer 103 including a light-emitting organic compound between the first electrode 101 and the second electrode 102. The positive temperature coefficient thermistor 140 includes a PTC layer 143 having a positive temperature coefficient between an upper electrode 142 and a lower electrode 141.

The first electrode 101 of the light-emitting element 130 is electrically connected to a first terminal 151 of the light-emitting module 150. The second electrode 102 of the light-emitting element 130 is not only electrically connected to the upper electrode 142 of the positive temperature coefficient thermistor 140, but also conducts heat generated by the light-emitting element 130 to the positive temperature coefficient thermistor 140. In addition, the lower electrode 141 is electrically connected to a second terminal 152 of the light-emitting module 150.

The light-emitting module 150 described above has, but is not limited to, a structure in which the light-emitting element 130 and the positive temperature coefficient thermistor 140 are electrically connected and thermally coupled through the second electrode 102 of the light-emitting element. For example, the light-emitting element and the positive temperature coefficient thermistor may be electrically connected and thermally coupled through the first electrode of the light-emitting element, although such a structure is not shown in the drawing. Alternatively, the light-emitting element and the positive temperature coefficient thermistor may be thermally coupled through the second electrode of the light-emitting element and electrically connected through the first electrode of the light-emitting element. Alternatively, the light-emitting element and the positive temperature coefficient thermistor may be thermally coupled through the first electrode of the light-emitting element and electrically connected through the second electrode of the light-emitting element.

(Material Connecting Light-Emitting Element and Positive Temperature Coefficient Thermistor)

The light-emitting element and the positive temperature coefficient thermistor are electrically connected and thermally coupled. For example, in the light-emitting module exemplified in FIG. 1A, the light-emitting element and the positive temperature coefficient thermistor are electrically connected and thermally coupled by the second electrode 102 and the upper electrode 142 which are formed with a continuous layer. However, a component that electrically connects the light-emitting element and the positive temperature coefficient thermistor and a component that thermally bonds the light-emitting element and the positive temperature coefficient thermistor are not necessarily the same. For example, the following structure is possible: one component electrically connects the light-emitting element and the positive temperature coefficient thermistor, and another component thermally bonds the light-emitting element and the positive temperature coefficient thermistor.

As the material that electrically connects the light-emitting element 130 and the positive temperature coefficient thermistor 140, a material having high electrical conductivity is preferred, and specifically a metal film containing an element selected from Al, Cr, Cu, Ta, Ti, Mo, and W, an alloy film containing any of these elements as a component, a metal nitride film (e.g., a titanium nitride film, a molybdenum nitride film, or a tungsten nitride film), or the like can be used. In order to avoid a problem of heat resistance or corrosiveness, the following structure is possible: a film of a high-melting point metal such as Ti, Mo, W, Cr, Ta, Nd, Sc, or Y, or a metal nitride film thereof (e.g., a titanium nitride film, a molybdenum nitride film, or a tungsten nitride film) is stacked on one or both of the lower and upper sides of a film of a metal such as Al or Cu.

As the material that thermally bonds the light-emitting element 130 and the positive temperature coefficient thermistor 140, a material having high thermal conductivity is preferred. The material having high thermal conductivity, typical examples of which are metals, does not necessarily have electrical conductance as well. For example, the following structure is possible: thermal bonding is formed using grease having thermal conductance or a material having an insulating property and high thermal conductivity, which is specifically silicone grease or silicone resin in which filler having high thermal conductivity is dispersed, while electrical connection is formed using a separate material, which has electrical conductivity.

As a material having both high electrical conductivity and high thermal conductivity, a metal having both high electrical conductivity and high thermal conductivity can be used alone or used so as to form a stacked structure with another material. For example, gold (Au), silver (Ag), copper (Cu), or aluminum (Al) is preferred. An example in which a plurality of materials is used to form a stacked structure may be as follows: an electrically conductive material which has a work function having a value contributing to excellent carrier injection, and high reflectivity is used for the layer in contact with the layer 103 including a light-emitting organic compound, and a material having high electrical conductivity and/or a material having high thermal conductivity, in particular, is/are used to be stacked over the electrically conductive material.

When the first terminal 151 and the second terminal 152 in the light-emitting module 150 having the above structure are connected to a power source, electric power can be supplied to the light-emitting element 130 through the positive temperature coefficient thermistor 140. Further, the layer 103 including a light-emitting organic compound in the light-emitting element 130 supplied with the electric power emits light toward and through the first electrode 101. Furthermore, when a short-circuit failure occurs in the light-emitting element 130, generated heat is conducted to the positive temperature coefficient thermistor 140 connected to the second electrode 102. The heat is detected by the positive temperature coefficient thermistor 140, so that the electric power supply to the light-emitting element can be interrupted or inhibited.

(Material Which Can Be Used for PTC Layer Having Positive Temperature Coefficient)

As a material that can be used for the PTC layer 143 having a positive temperature coefficient, for example, a material in which electrically conductive filler is dispersed in a high molecular material or a material in which a rare earth element is added as an impurity to barium titanate can be used.

The material in which electrically conductive filler is dispersed in a high molecular material (also referred to as polymer positive temperature coefficient [PPTC] material) is preferred, because the PPTC material can easily be reduced in size and has low electric resistance in the conduction state. As the high molecular material that can be used for the PPTC material, a high molecule having an insulating property such as polyethylene or polyvinylidene fluoride is preferred; as the electrically conductive filler, carbon black, nickel powder, or the like is preferred.

As the positive temperature coefficient thermistor, one having an operating temperature appropriate for the heat resistance of the light-emitting element can be selected; for example, one which can operate at temperatures greater than or equal to 100° C. and less than or equal to 200° C. can be used. This is because many of lighting devices are used in an environment where the temperature does not exceed 100° C. and because use at temperatures exceeding the glass-transition temperature of the light-emitting organic compound in the layer including the organic compound allows the reliability of the light-emitting element to lower. When the positive temperature coefficient thermistor is used at temperatures exceeding its operating temperature, it rapidly increases in electric resistance, and accordingly, operation of the positive temperature coefficient thermistor leads to interruption or inhibition of electric power supply to the light-emitting element connected to the positive temperature coefficient thermistor. Thus, a light-emitting element causing a short-circuit failure can be prevented from continuing generating heat at temperatures exceeding the operating temperature of the positive temperature coefficient thermistor.

The light-emitting module in accordance with any of the above embodiments of the present invention has a structure in which electric power supply to the light-emitting element is through the positive temperature coefficient thermistor thermally coupled with the light-emitting element. Because of this structure, heat generated when a short-circuit failure of the light-emitting element occurs can be detected by the positive temperature coefficient thermistor, and the electric power supply to the light-emitting element can be interrupted or inhibited. Thus, it is possible to provide a light-emitting module in which a light-emitting element suffering a short-circuit failure does not cause wasteful electric power consumption.

The light-emitting module in accordance with the above embodiment of the present invention has a structure in which electric power supply to the light-emitting element is through the positive temperature coefficient thermistor thermally coupled with the light-emitting element through an electrically conductive material. Because of this structure, the electrically conductive material has both functions of supplying electric power to the light-emitting element and of conducting heat generated by the light-emitting element to the positive temperature coefficient thermistor. Accordingly, heat generated when the short-circuit failure of the light-emitting element occurs can be detected by the positive temperature coefficient thermistor, and the electric power supply to the light-emitting element can be interrupted or inhibited. Thus, it is possible to provide a light-emitting module in which a light-emitting element suffering a short-circuit failure does not cause wasteful electric power consumption.

(Modification Example 1)

Another mode of a light-emitting module in accordance with one embodiment of the present invention is illustrated in FIG. 1B. The light-emitting module 150 exemplified in FIG. 1B includes the positive temperature coefficient thermistor 140 over the substrate 100 and the light-emitting element 130 over the positive temperature coefficient thermistor 140. In addition, the light-emitting element 130 is separated from impurities in the air by the sealant 158 which surrounds the light-emitting element 130 and the sealing material 159 which can transmit light emitted by the light-emitting element 130.

The positive temperature coefficient thermistor 140 is included between the substrate 100 and the light-emitting element 130. The positive temperature coefficient thermistor 140 includes the PTC layer 143 having a positive temperature coefficient between the lower electrode 141 and the first electrode 101 of the light-emitting element.

The positive temperature coefficient thermistor 140 may be provided over the substrate 100 in such a way that the separately fabricated positive temperature coefficient thermistor 140 is mounted on a surface of the substrate 100, or in such a way that the PTC layer 143 having a positive temperature coefficient is stacked over the lower electrode 141 provided over a surface of the substrate 100, an end portion of the first electrode 101 is covered with the partition 104 having an insulating property, and the first electrode 101 of the light-emitting element 130 which also serves as the upper electrode is stacked over the PTC layer 143. The PTC layer 143 having a positive temperature coefficient may be formed over the lower electrode 141 in such a way that, for example, a PTC material processed into a sheet is laminated or transferred.

The light-emitting element 130 includes the first electrode 101 formed over the PTC layer 143, the partition 104 covering an end portion of the first electrode 101, and the layer 103 including a light-emitting organic compound between the first electrode and the second electrode 102 overlapping with the first electrode.

In this modification example, one of the electrodes of the positive temperature coefficient thermistor 140 also serves as the first electrode 101 of the light-emitting element 130, so that the light-emitting element 130 and the positive temperature coefficient thermistor 140 are electrically connected and thermally coupled with each other. Therefore, in a preferred structure, the first electrode 101 includes an electrically conductive material having high thermal conductivity; in a particularly preferred structure, a metal having high electrical conductivity and high thermal conductivity is used alone or used so as to form a stacked structure with another electrically conductive material. Note that an electrically conductive material having a property of transmitting light emitted by the layer 103 including a light-emitting organic compound is used for the second electrode 102 of the light-emitting element 130.

When the first terminal 151 and the second terminal 152 in the light-emitting module 150 having the above structure are connected to a power source, electric power can be supplied to the light-emitting element 130 through the positive temperature coefficient thermistor 140. Further, the layer 103 including a light-emitting organic compound in the light-emitting element 130 supplied with the electric power emits light toward and through the second electrode 102. Furthermore, when a short-circuit failure occurs in the light-emitting element 130, generated heat is conducted to the positive temperature coefficient thermistor 140 provided in contact with the first electrode 101. The heat is detected by the positive temperature coefficient thermistor 140, so that the electric power supply to the light-emitting element can be interrupted or inhibited.

The light-emitting module in accordance with any of the above embodiments of the present invention has a structure in which electric power supply to the light-emitting element is through the positive temperature coefficient thermistor thermally coupled with the light-emitting element and the light-emitting element includes an electrode that transmits light emitted by the layer including the light-emitting organic compound as one of the pair of electrodes, and which includes the positive temperature coefficient thermistor on the side of the other of the pair of electrodes. Because of this structure, heat generated when a short-circuit failure of the light-emitting element occurs can be detected by the positive temperature coefficient thermistor, and the electric power supply to the light-emitting element can be interrupted or inhibited. Further, light emission can be extracted through one of the pair of electrodes of the light-emitting element which can transmit light, that is, the electrode toward which the positive temperature coefficient thermistor is not provided. Thus, it is possible to provide a light-emitting module in which a light-emitting element suffering a short-circuit failure does not cause wasteful electric power consumption, or a light-emitting module in which the positive temperature coefficient thermistor does not intercept light emitted by the light-emitting element.

(Modification Example 2)

Another mode of a light-emitting module in accordance with one embodiment of the present invention is illustrated in FIG. 1C. In the light-emitting module 150 exemplified in FIG. 1C, the light-emitting element 130 on one side of the substrate 100 and the positive temperature coefficient thermistor 140 on the opposite side of the substrate 100 are included so as to overlap with each other. In addition, the light-emitting element 130 is separated from impurities in the air by the sealant 158 which surrounds the light-emitting element 130 and the sealing material 159 which can transmit light emitted by the light-emitting element 130.

The sides of the substrate 100 each have an insulating surface, one of which is provided with the first electrode 101 of the light-emitting element 130 and the opposite of which is provided with the lower electrode 141 of the positive temperature coefficient thermistor 140. The light-emitting element 130 includes the first electrode 101 in contact with the one side of the substrate 100, the partition 104 covering an end portion of the first electrode 101, the second electrode 102 overlapping with the first electrode 101, and the layer 103 including a light-emitting organic compound between the first electrode 101 and the second electrode 102. The positive temperature coefficient thermistor 140 includes the PTC layer 143 having a positive temperature coefficient between the lower electrode 141 in contact with the opposite surface of the substrate 100 and the upper electrode 142.

The first electrode 101 of the light-emitting element 130 is electrically connected to the lower electrode 141 of the positive temperature coefficient thermistor 140 through an opening provided through the substrate 100. In addition, the lower electrode 141 of the positive temperature coefficient thermistor 140 conducts heat generated by the light-emitting element 130 to the positive temperature coefficient thermistor 140 through the opening provided through the substrate 100. The upper electrode 142 of the positive temperature coefficient thermistor 140 is electrically connected to the first terminal 151 of the light-emitting module 150. In addition, the second electrode 102 of the light-emitting element 130 is electrically connected to the second terminal 152 of the light-emitting module 150.

In this modification example, the lower electrode 141 of the positive temperature coefficient thermistor 140 and the first electrode 101 of the light-emitting element 130 are connected through the opening through the substrate, so that the light-emitting element 130 and the positive temperature coefficient thermistor 140 are electrically connected and thermally coupled. Therefore, in a preferred structure, the lower electrode 141 includes an electrically conductive material having high thermal conductivity; in a particularly preferred structure, a metal having high electrical conductivity and high thermal conductivity is used alone or used so as to form a stacked structure with another electrically conductive material. Note that an electrically conductive material having a property of transmitting light emitted by the layer 103 including a light-emitting organic compound is used for the second electrode 102 of the light-emitting element 130.

When the first terminal 151 and the second terminal 152 in the light-emitting module 150 having the above structure are connected to a power source, electric power can be supplied to the light-emitting element 130 through the positive temperature coefficient thermistor 140. Further, the layer 103 including a light-emitting organic compound in the light-emitting element 130 supplied with the electric power emits light toward and through the second electrode 102. Furthermore, when a short-circuit failure occurs in the light-emitting element 130, generated heat is conducted to the positive temperature coefficient thermistor 140 connected to the first electrode 101. The heat is detected by the positive temperature coefficient thermistor 140, so that the electric power supply to the light-emitting element can be interrupted or inhibited.

The light-emitting module in accordance with any of the above embodiments of the present invention has a structure in which electric power supply to the light-emitting element is through the positive temperature coefficient thermistor thermally coupled with the light-emitting element and the light-emitting element includes an electrode that transmits light emitted by the layer including the light-emitting organic compound as one of the pair of electrodes, and which includes the positive temperature coefficient thermistor on the side of the other of the pair of electrodes. Because of this structure, heat generated when a short-circuit failure of the light-emitting element occurs can be detected by the positive temperature coefficient thermistor, and the electric power supply to the light-emitting element can be interrupted or inhibited. Further, light emission can be extracted through one of the pair of electrodes of the light-emitting element which can transmit light, that is, the electrode toward which the positive temperature coefficient thermistor is not provided. Thus, it is possible to provide a light-emitting module in which a light-emitting element suffering a short-circuit failure does not cause wasteful electric power consumption, or a light-emitting module in which the positive temperature coefficient thermistor does not intercept light emitted by the light-emitting element.

This embodiment can be combined as appropriate with any of the other embodiments described in this specification.

[Embodiment 2]

Figure 2A:
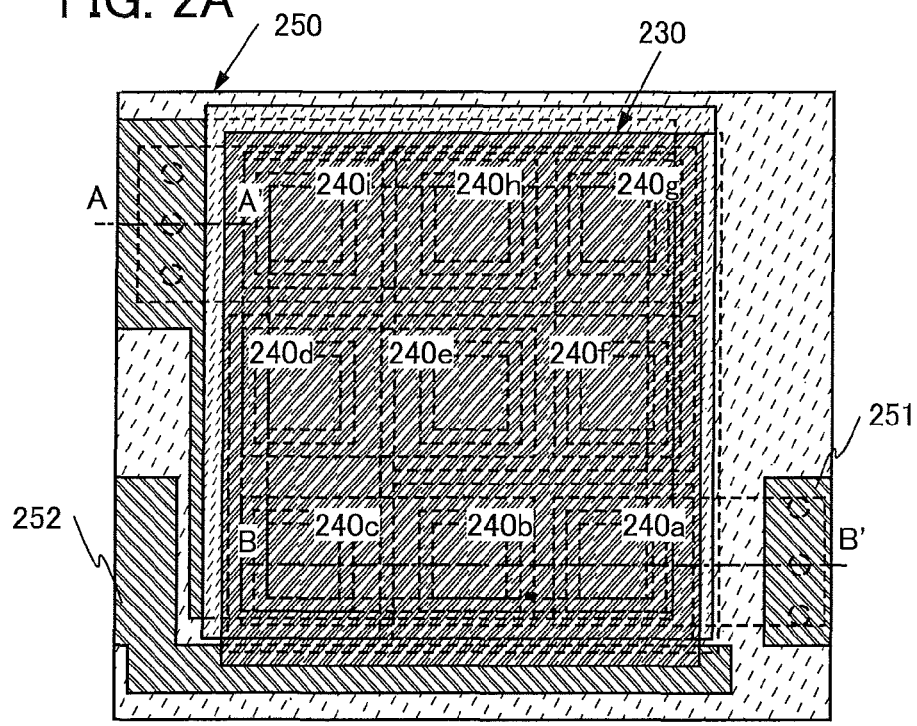
FIGS. 2A and 2B illustrate a light-emitting module in accordance with one embodiment.
Figure 2B:
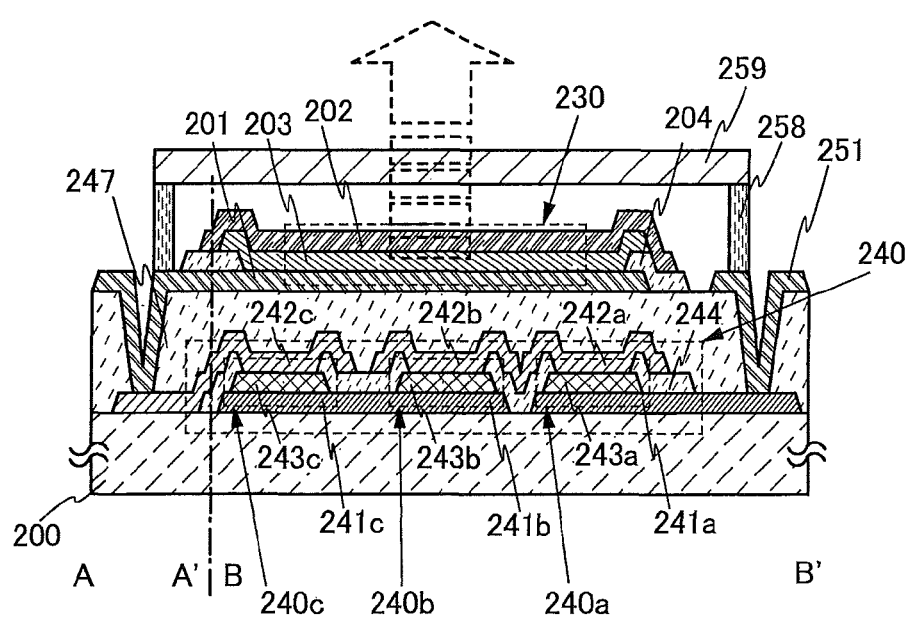

With reference to FIGS. 2A and 2B, this embodiment illustrates a light-emitting module having a structure where electric power is supplied to a light-emitting element through a positive temperature coefficient thermistor array in which a plurality of positive temperature coefficient thermistors is connected in series and which is thermally coupled with the light-emitting element, and specifically illustrates a light-emitting module including an organic EL element over a substrate and a positive temperature coefficient thermistor array in which a plurality of positive temperature coefficient thermistors is connected in series and which is thermally coupled with the organic EL element, where electric power is supplied to the organic EL element through the positive temperature coefficient thermistor array.

A top view of a structure of a light-emitting module 250 in accordance with one embodiment of the present invention is illustrated in FIG. 2A, and a cross section taken along the section lines A-A' and B-B' of FIG. 2A is illustrated in FIG. 2B.

The light-emitting module 250 exemplified in FIGS. 2A and 2B includes, over a substrate 200, a light-emitting element 230 and nine positive temperature coefficient thermistors including a positive temperature coefficient thermistor 240a, a positive temperature coefficient thermistor 240b, and a positive temperature coefficient thermistor 240c. Further, FIG. 2B illustrates a sealant 258 which surrounds the light-emitting element 230 and a sealing material 259 which can transmit light emitted by the light-emitting element 230.

The light-emitting element 230 is separated from impurities in the air by the sealant 258 and the sealing material 259.

For the substrate 200, a material having high thermal conductivity is preferred. This is because the substrate functions as a heat sink which exhausts heat generated by the light-emitting element 230 that operates without causing abnormal heat generation. As a substrate that has an insulating surface on the side where the element is mounted and has high thermal conductivity as a whole, a metal substrate with a surface covered with a material having an insulating property, and the like can be an example.

Figure 3A:
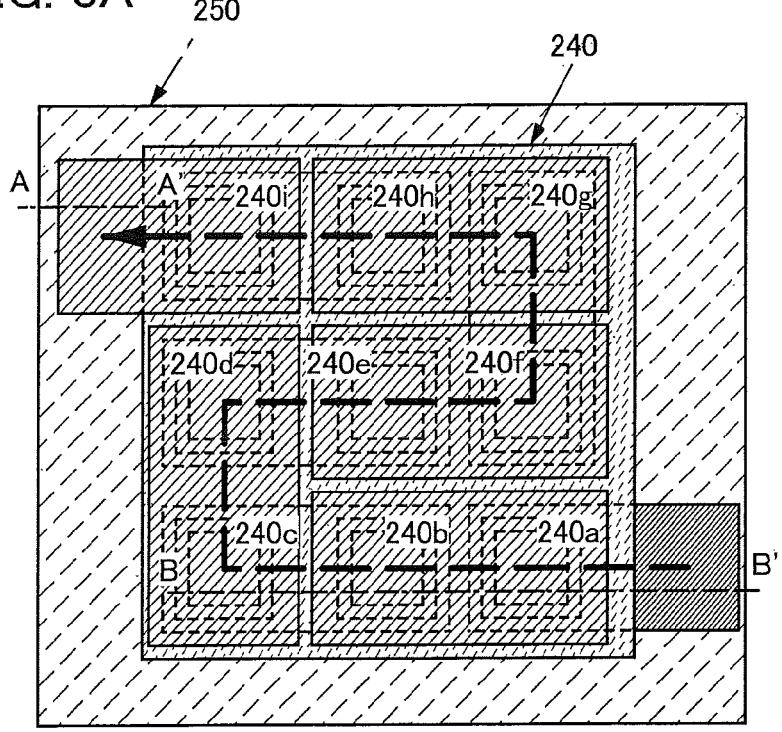
FIGS. 3A and 3B illustrate a light-emitting module in accordance with one embodiment.
Figure 3B:
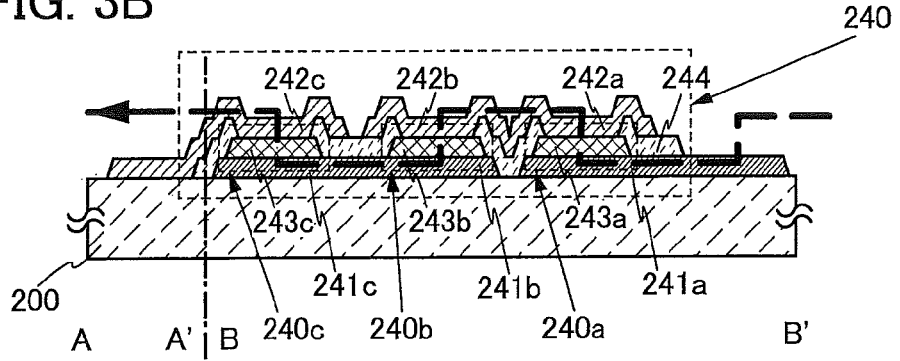

A structure of the positive temperature coefficient thermistor array included in the light-emitting module 250 is described with reference to FIGS. 3A and 3B. A top view of the positive temperature coefficient thermistor array 240 is illustrated in FIG. 3A. The positive temperature coefficient thermistor array 240 includes the nine positive temperature coefficient thermistors (240a, 240b, 240c, 240d, 240e, 240f, 240g, 240h, and 240i) connected in series.

An example of the way how the positive temperature coefficient thermistors are connected in series is described with reference to FIG. 3B. FIG. 3B is a cross-sectional view of the positive temperature coefficient thermistors 240a, 240b, and 240c, and the positive temperature coefficient thermistors are connected to each other in series. Note that the positive temperature coefficient thermistor 240a includes a PTC layer 243a between a lower electrode 241a in contact with the substrate 200 and an upper electrode 242a; the positive temperature coefficient thermistor 240b includes a PTC layer 243b a between a lower electrode 241b in contact with the substrate 200 and an upper electrode 242b; and the positive temperature coefficient thermistor 240c includes a PTC layer 243c between a lower electrode 241c in contact with the substrate 200 and an upper electrode 242c.

The upper electrodes 242a and 242b in the positive temperature coefficient thermistors 240a and 240b are connected to each other, and the lower electrodes 241b and 241c in the positive temperature coefficient thermistors 240b and 240c are connected to each other. In such a structure, the positive temperature coefficient thermistors are connected to each other in series, so that current flows through the positive temperature coefficient thermistors 240a, 240b, and 240c as indicated by the thick arrow illustrated in FIG. 3B. Note that in FIG. 3A, the thick arrow represents an example of current flowing through the positive temperature coefficient thermistor array 240.

The positive temperature coefficient thermistor array 240 having such a structure is thermally coupled with the light-emitting element 230; thus, while the light-emitting element 230 is divided into a plurality of regions (nine regions in this embodiment), heat generated when a short-circuit failure of the light-emitting element 230 occurs can be monitored. Then, the heat generated when a short-circuit failure occurs in one of the plurality of regions is detected, and accordingly, the electric power supply to the light-emitting element can be interrupted or inhibited. Thus, it is possible to provide a light-emitting module in which, even when the short-circuit failure of the light-emitting element is small for its area, the positive temperature coefficient thermistor array does not miss the local heat generation and thus the light-emitting element causing a short-circuit failure does not cause wasteful electric power consumption.

The light-emitting element 230 included in the light-emitting module 250 includes a first electrode 201 over a planarization film 247 provided over the positive temperature coefficient thermistor array, a partition 204 covering an end portion of the first electrode 201, a second electrode 202 overlapping with the first electrode 201, and a layer 203 including a light-emitting organic compound between the first electrode 201 and the second electrode 202 (see FIG. 2B).

For the second electrode 202 of the light-emitting element 230, an electrically conductive material having a property of transmitting light emitted by the layer 203 including a light-emitting organic compound is used. Further, an end portion of the second electrode 202 is connected to a second terminal 252 of the light-emitting module 250.

The first electrode 201 of the light-emitting element 230 is electrically connected to the upper electrode 242c of the positive temperature coefficient thermistor array 240 through an opening provided through the planarization film 247. Further, the light-emitting element 230 and the positive temperature coefficient thermistor array 240 are thermally coupled through the planarization film 247.

The planarization film 247 is used in order to planarize a surface of the first electrode 201 used in the light-emitting element 230. For the planarization film 247, a resin material such as polyimide, acrylic, benzocyclobutene, polyamide, or epoxy can be used. Other than such a resin material, a low dielectric constant material (low-k material), a siloxane-based resin, phosphosilicate glass (PSG), borophosphosilicate glass (BPSG), or the like can be used. In particular, a material having high thermal conductivity is preferably included. In this embodiment, a material having an insulating property is preferred, because the upper electrodes of the positive temperature coefficient thermistors constituting the positive temperature coefficient thermistor array need to be insulated from the first electrode of the light-emitting element. Further, a film having a high barrier property may be stacked in order to prevent diffusion of impurities into the light-emitting element.

The lower electrode of the positive temperature coefficient thermistor is connected to the first terminal 251 of the light-emitting module 250 through an opening provided through the planarization film 247.

When the first terminal 251 and the second terminal 252 in the light-emitting module 250 having the above structure are connected to a power source, electric power can be supplied to the light-emitting element 230 through the positive temperature coefficient thermistor array 240. Further, the layer 203 including a light-emitting organic compound in the light-emitting element 230 supplied with the electric power emits light toward and through the second electrode 202. Furthermore, when a short-circuit failure occurs in the light-emitting element 230, generated heat is conducted through the planarization film 247 to any of the plurality of positive temperature coefficient thermistors provided in the positive temperature coefficient thermistor array 240. Since the positive temperature coefficient thermistors constituting the positive temperature coefficient thermistor array 240 are connected in series, detection of the heat due to the short-circuit failure by at least one of the positive temperature coefficient thermistors enables the positive temperature coefficient thermistor array to interrupt or inhibit electric power supply to the light-emitting element. In other words, generation of a short-circuit failure in the light-emitting element 230 can be monitored in each of the regions into which division is made by the plurality of positive temperature coefficient thermistors.

The light-emitting module in accordance with any of the above embodiments of the present invention has a structure in which electric power supply to the light-emitting element is through a positive temperature coefficient thermistor array which is thermally coupled with the light-emitting element and in which a plurality of positive temperature coefficient thermistors is connected in series. Because of this structure, while dividing the light-emitting element into a plurality of regions, the plurality of positive temperature coefficient thermistors constituting the positive temperature coefficient thermistor array can detect heat generated when a short-circuit failure of the light-emitting element occurs, and the electric power supply to the light-emitting element can be interrupted or inhibited. Thus, it is possible to provide a light-emitting module in which, even when the short-circuit failure of the light-emitting element is small for its area, the positive temperature coefficient thermistor array does not miss the local heat generation and the light-emitting element causing a short-circuit failure does not cause wasteful electric power consumption.

This embodiment can be combined as appropriate with any of the other embodiments described in this specification.

[Embodiment 3]

Figure 8A:
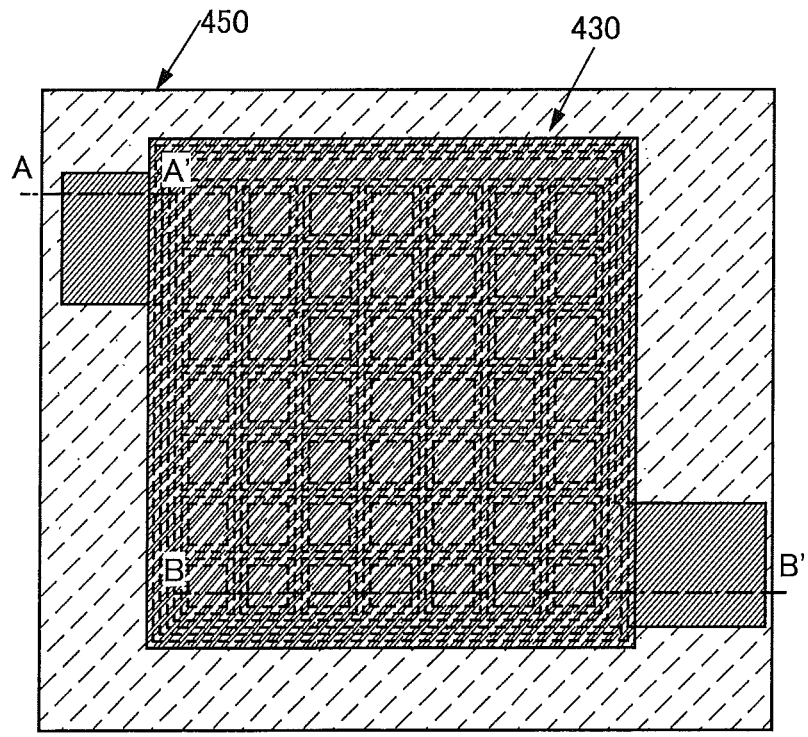
FIGS. 8A and 8B illustrate a light-emitting module in accordance with one embodiment.
Figure 8B:
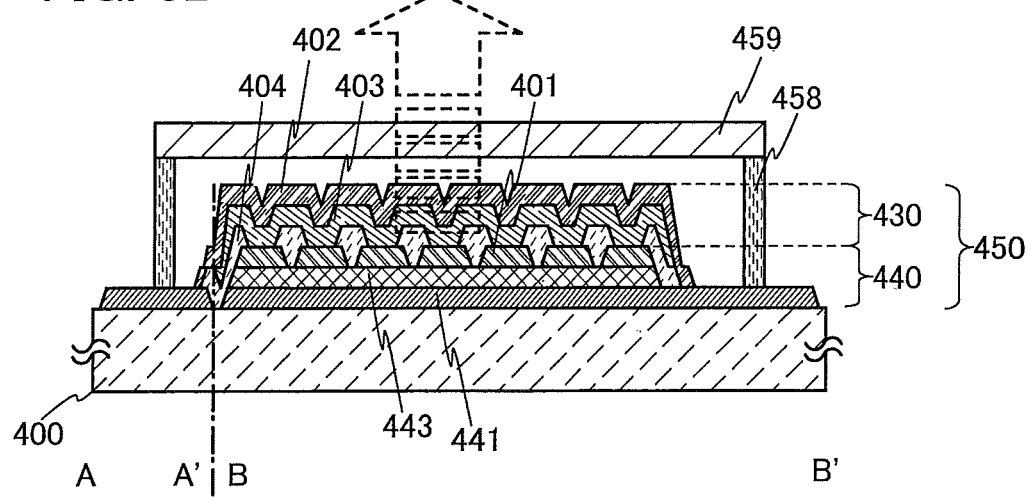

With reference to FIGS. 8A and 8B, this embodiment illustrates a light-emitting module having a plurality of structures provided in parallel in each of which electric power is supplied to a light-emitting element through a positive temperature coefficient thermistor thermally coupled with the light-emitting element, and specifically illustrates a structure in which a plurality of organic EL elements is provided in a matrix over upper electrodes of the positive temperature coefficient thermistors provided over a substrate. Note that each positive temperature coefficient thermistor and one of the organic EL elements are thermally coupled and electrically connected in series.

A top view of a structure of a light-emitting module 450 in accordance with one embodiment of the present invention is illustrated in FIG. 8A, and a cross section taken along the section lines A-A' and B-B' of FIG. 8A is illustrated in FIG. 8B.

The light-emitting module 450 illustrated as an example in FIG. 8A includes a light-emitting element matrix 430. Note that seven rows and seven columns of light-emitting elements are provided in the exemplified light-emitting element matrix 430. As illustrated in FIG. 8B, the light-emitting module 450 includes positive temperature coefficient thermistors 440 between the light-emitting element matrix 430 and a substrate 400.

Each positive temperature coefficient thermistor 440 includes a lower electrode 441, a PTC layer 443 having a positive temperature coefficient over the lower electrode 441, and an upper electrode over the PTC layer 443. For simplification of manufacture, the lower electrodes 441 of the positive temperature coefficient thermistors 440 may be formed as a single continuous layer and the PTC layers 443 of the positive temperature coefficient thermistors 440 may also be formed as a single continuous layer, as illustrated in the drawing. The upper electrodes of the positive temperature coefficient thermistors 440 exemplified in this embodiment, which have been divided into seven rows and seven columns, also serve as first electrodes of the light-emitting elements constituting the light-emitting element matrix 430.

The light-emitting elements constituting the light-emitting element matrix 430 are formed over the positive temperature coefficient thermistor 440. The light-emitting elements exemplified in this embodiment each include the first electrode serving as the upper electrode of the positive temperature coefficient thermistor 440, a partition 404 covering an end portion of the first electrode, a layer 403 including a light-emitting organic compound which is in contact with the first electrode in an opening of the partition 404, and a second electrode 402 in contact with the layer 403 including a light-emitting organic compound. For example, a first electrode 401 illustrated in FIG. 8B is one of the upper electrodes of the positive temperature coefficient thermistors 440 and is one of the first electrodes arranged in seven rows and seven columns In addition, the first electrode 401 and the layer 403 including a light-emitting organic compound are in contact with each other in the opening of the partition 404.

Further, FIG. 8B illustrates a sealant 458 which surrounds the light-emitting element matrix 430 and a sealing material 459 which can transmit light emitted by the light-emitting element matrix 430. The light-emitting element matrix 430 is separated from impurities in the air by the sealant 458 and the sealing material 459.

The light-emitting element matrix 430 and the positive temperature coefficient thermistors 440 which constitute the light-emitting module 450 can be fabricated using the same materials as those of the light-emitting element and the positive temperature coefficient thermistor described in Embodiment 2.

The light-emitting module 450 having such a structure includes a matrix with seven rows and seven columns of units in each of which the positive temperature coefficient thermistor 440 and the light-emitting element are electrically connected in series, and the units are electrically connected in parallel through the lower electrodes of the positive temperature coefficient thermistors 440 (the lower electrodes illustrated in the drawing are formed as a single continuous layer). With such a structure, the PTC layer at temperatures exceeding the operating temperature of the positive temperature coefficient thermistor 440 is more electrically-resistant or -insulated, and accordingly, the PTC layer at temperatures exceeding the operating temperature loses electrical continuity with another PTC layer to become electrically isolated.

The light-emitting elements arranged in a matrix of seven rows and seven columns are thermally coupled with the PTC layers of the positive temperature coefficient thermistors 440 with which the first electrodes of the elements are in contact. Therefore, a light-emitting element suffering a short-circuit failure heats the PTC layer that is just under the light-emitting element and that overlaps therewith. The PTC layer at temperatures exceeding the operating temperature of the positive temperature coefficient thermistor 440 due to heating is more electrically-resistant or -insulated, and accordingly, electric power supply to the first electrode of the light-emitting element connected to the PTC layer can be interrupted or inhibited.

Note that each light-emitting element in a matrix exemplified in this embodiment can be formed to have any of a variety of sizes, preferably has a size to be difficult to see visibly, which is specifically a size with a diameter of 5 mm or less, preferably a minute size with a diameter of 1 mm or less. Without limitation to matrix arrangement, the light-emitting elements may be irregularly arranged. Further, the light-emitting elements may have a variety of forms without limitation to a quadrangle, for example, the form in which formless shapes are continuous, and specifically may be determined by the shape of the electrically conductive filler (e.g., carbon black or nickel powder) included in the PTC layer.

(Modification Example)

Figure 9:
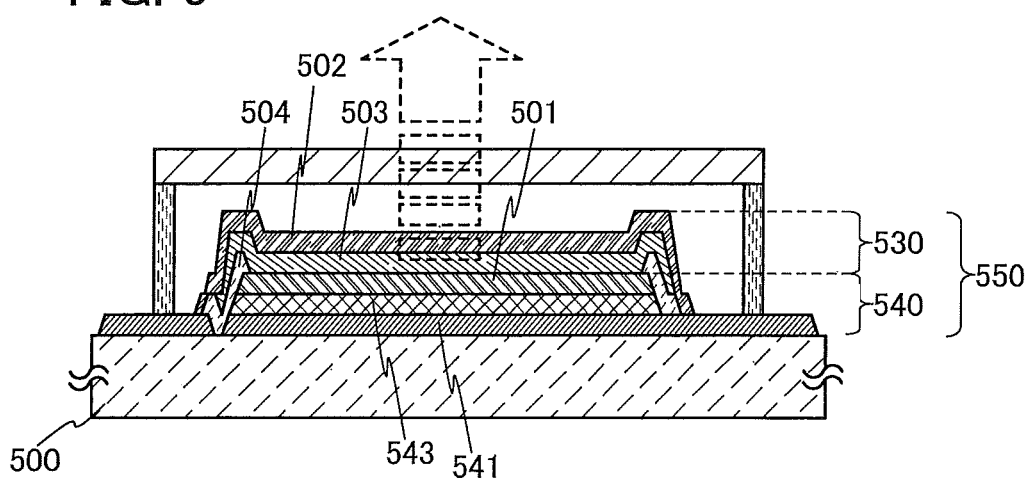
FIG. 9 illustrates a light-emitting module in accordance with one embodiment.

Another mode of a light-emitting module in accordance with one embodiment of the present invention is illustrated in FIG. 9. A light-emitting module 550 exemplified in FIG. 9 includes a light-emitting element 530 and a positive temperature coefficient thermistor 540 over a substrate 500.

The positive temperature coefficient thermistor 540 of this modification example exemplified in this embodiment includes a lower electrode 541, a PTC layer 543 having a positive temperature coefficient over the lower electrode 541, and an upper electrode over the PTC layer 543. The upper electrode of the positive temperature coefficient thermistor 540 exemplified in this embodiment also serves as a first electrode 501 of the light-emitting element 530.

For the first electrode 501 of this embodiment, a material having lower electrical conductivity than metals is used. Examples of a material that can be used for the first electrode 501 include a film of an electrically conductive polymer (e.g., a high molecular compound to which acid is added, such as poly(3,4-ethylenedioxythiophene)/poly(styrenesulfonic acid) (PEDOT/PSS) and polyaniline/poly(styrenesulfonic acid) (PAni/PSS)), a film in which a material having an acceptor property (e.g., molybdenum oxide) is mixed into an organic compound, and a film in which a material having a donor property (e.g., Li, alkali metals, or alkaline earth metals) is mixed into an organic compound.

The first electrode 501 planarizes a surface of the PTC layer 543. Especially the first electrode 501 that can be obtained by film formation using a coating method is preferred.

The importance of use of a film having reduced electrical conductivity for the first electrode 501 of the light-emitting element 530, which also serves as the upper electrode of the positive temperature coefficient thermistor 540, is described below. The light-emitting element is thermally coupled with the PTC layer of the positive temperature coefficient thermistor 540 with which the first electrode is in contact. Therefore, when a short-circuit failure occurs in part of the light-emitting element, generated heat is conducted to a region in the PTC layer which overlaps with the short-circuit failure. The region in the PTC layer at temperatures exceeding the operating temperature of the positive temperature coefficient thermistor 540 due to heating is more electrically-resistant or -insulated, and accordingly, electric power supply to the first electrode of the light-emitting element connected to the region can be interrupted or inhibited.

In such a case, when the electrical conductivity of the first electrode 501 of the light-emitting element 530, which also serves as the upper electrode of the positive temperature coefficient thermistor 540, is reduced, there is an effect of reducing current flowing into the short-circuit failure portion from the vicinity of the region in the PTC layer at temperatures exceeding the operating temperature of the positive temperature coefficient thermistor 540.

The light-emitting module 550 having such a structure enables the light emission area to be enlarged.

The light-emitting module in accordance with the above embodiment of the present invention has a plurality of units provided in parallel in each of which electric power is supplied to the light-emitting element through the positive temperature coefficient thermistor thermally coupled with the light-emitting element. Because of this structure, heat generated when a short-circuit failure of the light-emitting element occurs can be detected by a region of the positive temperature coefficient thermistor which is thermally coupled with the light-emitting element, and the electric power supply to the light-emitting element can be interrupted or inhibited. Thus, it is possible to provide a light-emitting module in which, even when the short-circuit failure of the light-emitting module is small for its light emission area, the positive temperature coefficient thermistor does not miss the local heat generation and the light-emitting element causing a short-circuit failure does not cause wasteful electric power consumption.

This embodiment can be combined as appropriate with any of the other embodiments described in this specification.

[Embodiment 4]

Figure 4:
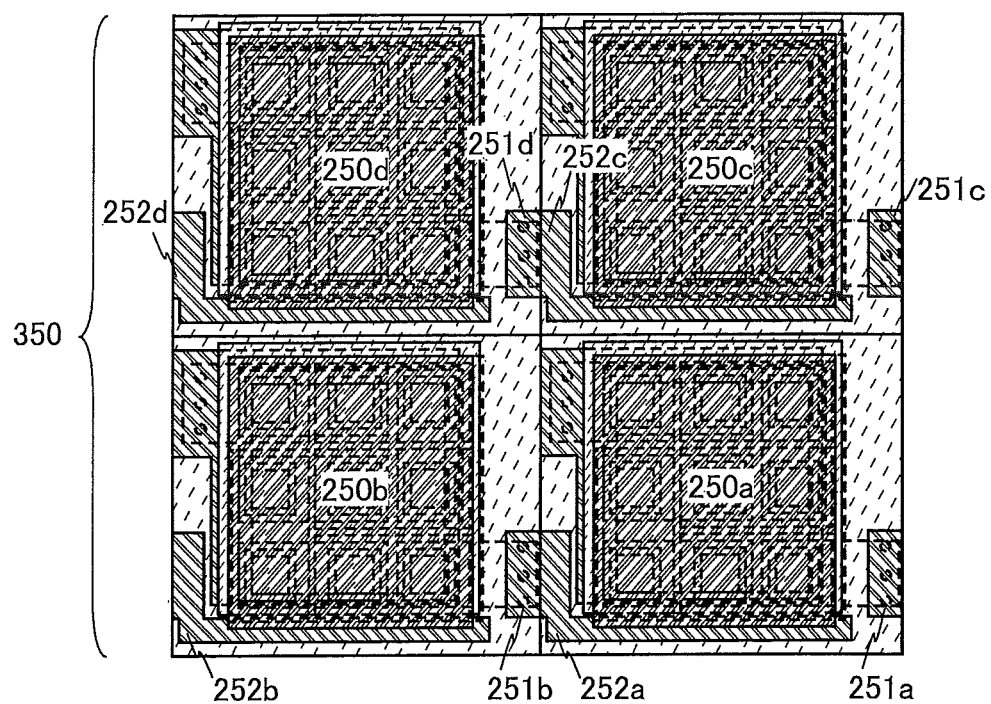
FIG. 4 illustrates a light-emitting panel in accordance with one embodiment.

With reference to FIG. 4, this embodiment illustrates a light-emitting panel including a plurality of adjacent light-emitting modules in which electric power is supplied to light-emitting elements through a positive temperature coefficient thermistor thermally coupled with the light-emitting elements, and specifically illustrates a light-emitting panel provided with adjacent light-emitting modules including organic EL elements over a substrate and a positive temperature coefficient thermistor array in which a plurality of positive temperature coefficient thermistors is connected in series and which is thermally coupled with the organic EL elements, where electric power is supplied to the organic EL elements is through the positive temperature coefficient thermistor array.

A top view of a structure of a light-emitting panel 350 in accordance with one embodiment of the present invention is illustrated in FIG. 4.

The light-emitting panel 350 exemplified in FIG. 4 includes a light-emitting module 250a, a light-emitting module 250b, a light-emitting module 250c, and a light-emitting module 250d, which are provided adjacent to each other and have the same structure as that of the light-emitting module 250 described above in Embodiment 2.

A second terminal 252a of the light-emitting module 250a and a first terminal 251b of the light-emitting module 250b are connected to each other, so that the light-emitting module 250a and the light-emitting module 250b are connected in series. Further, a second terminal 252c of the light-emitting module 250c and a first terminal 251d of the light-emitting module 250d are connected to each other, so that the light-emitting module 250c and the light-emitting module 250d are connected in series.

A first terminal 251a and a second terminal 252b, which are terminals of the light-emitting modules included in the light-emitting panel 350, are connected to a first constant current power source not shown in the drawing, while a first terminal 251c and a second terminal 252d, which are also terminals of the light-emitting modules included in the light-emitting panel 350, are connected to a second constant current power source not shown in the drawing. Thus, the light-emitting panel 350 can perform lighting with uniform brightness.

Further, when a short-circuit failure occurs in a light-emitting element of the light-emitting module included in the light-emitting panel 350, generated heat is detected by the positive temperature coefficient thermistor included in the light-emitting module, so that the electric power supply to the light-emitting element can be interrupted or inhibited. Thus, it is possible to provide a light-emitting panel in which a light-emitting element suffering a short-circuit failure does not cause wasteful electric power consumption, or a light-emitting panel in which a light-emitting element suffering a short-circuit failure does not allow the reliability of an adjacent light-emitting element to lower.

This embodiment can be combined as appropriate with any of the other embodiments described in this specification.

[Embodiment 5]

This embodiment illustrates an example of a light-emitting element that can be used for the light-emitting module having a structure where electric power is supplied to a light-emitting element through a positive temperature coefficient thermistor thermally coupled with the light-emitting element, with reference to FIGS. 5A to 5C and FIGS. 6A and 6B.

The light-emitting element exemplified in this embodiment includes a first electrode, a second electrode, and a layer that includes a light-emitting organic compound (hereinafter referred to as an EL layer) between the first electrode and the second electrode. In this embodiment, the first electrode formed over a substrate functions as an anode, and the second electrode functions as a cathode. The EL layer is provided between the first electrode and the second electrode, and a structure of the EL layer can be selected as appropriate in accordance with material properties of the first electrode and second electrode. An example of the structure of the light-emitting element is described below; it is needless to say that the structure of the light-emitting element is not limited to this example.

(Example 1 of Light-Emitting Element Structure)

Figure 5A:
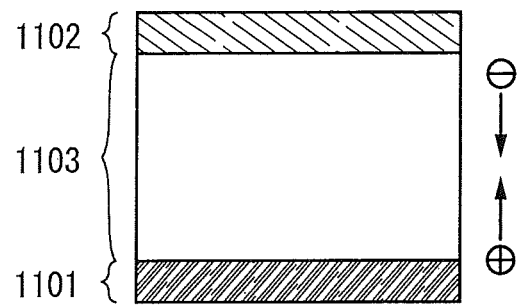
FIGS. 5A to 5C each illustrate a structure of a light-emitting element in accordance with one embodiment.

An example of the structure of the light-emitting element is illustrated in FIG. 5A. In the light-emitting element illustrated in FIG. 5A, an EL layer 1103 is interposed between an anode 1101 and a cathode 1102.

When a voltage higher than the threshold voltage of the light-emitting element is applied between the anode 1101 and the cathode 1102, holes from the anode 1101 side and electrons from the cathode 1102 side are injected into the EL layer 1103. The injected electrons and holes recombine in the EL layer 1103, so that a light-emitting substance included in the EL layer 1103 emits light.

The EL layer 1103 includes at least a light-emitting layer including the light-emitting substance, and may have a structure in which the light-emitting layer and a layer other than the light-emitting layer are stacked. Examples of the layer other than the light-emitting layer include a layer that includes a substance having a high hole-injection property, a substance having a high hole-transport property, a substance having a poor hole-transport property (a substance that blocks holes), a substance having a high electron-transport property, a substance having a high electron-injection property, a substance having a bipolar property (a substance having a high electron-transport property and a high hole-transport property), or the like.

Figure 5B:
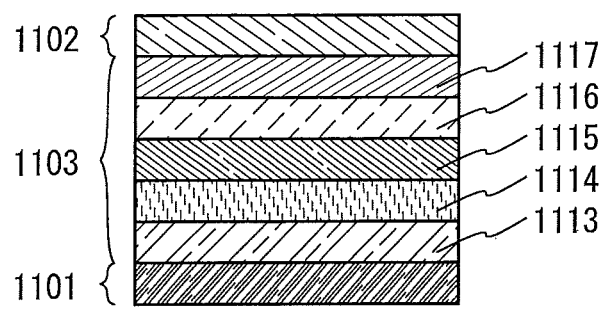

A specific example of a structure of the EL layer 1103 is illustrated in FIG. 5B. In the EL layer 1103 illustrated in FIG. 5B, a hole-injection layer 1113, a hole-transport layer 1114, a light-emitting layer 1115, an electron-transport layer 1116, and an electron-injection layer 1117 are stacked in this order from the anode 1101 side.

(Example 2 of Light-Emitting Element Structure)

Figure 5C:
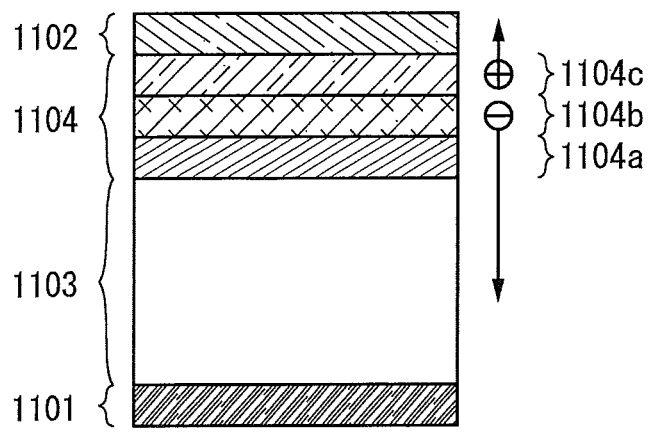

Another example of the structure of the light-emitting element is illustrated in FIG. 5C. In the light-emitting element exemplified in FIG. 5C, the EL layer 1103 is interposed between the anode 1101 and the cathode 1102. Further, an intermediate layer 1104 is provided between the cathode 1102 and the EL layer 1103. For the EL layer 1103 in Example 2 of Light-Emitting Element Structure, the same structure as that in Example 1 of Light-Emitting Element Structure described above can be applied, and for the details, the explanation in Example 1 of Light-Emitting Element Structure can be referred to.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b, which has a high electron-transport property, rapidly accepts the electrons generated in the first charge generation region 1104c and donates them to the electron-injection buffer 1104a. The electron-injection buffer 1104a can reduce a barrier to electron injection into the EL layer 1103, so that the efficiency of the electron injection into the EL layer 1103 can be increased. Thus, the electrons generated in the first charge generation region 1104c are injected into the LUMO level of the EL layer 1103 through the electron-relay layer 1104b and the electron-injection buffer 1104a.

In addition, the electron-relay layer 1104b can prevent interaction in which, for example, a substance included in the first charge generation region 1104c and a substance included in the electron-injection buffer 1104a react with each other at an interface between the charge generation region 1104c and the electron-injection buffer 1104a to impair the functions of the first charge generation region 1104c and the electron-injection buffer 1104a.

(Example 3 of Light-Emitting Element Structure)

Figure 6A:
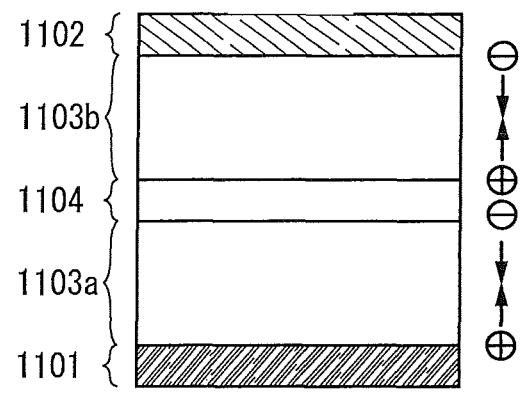
FIGS. 6A and 6B each illustrate a structure of a light-emitting element in accordance with one embodiment.
Figure 6B:
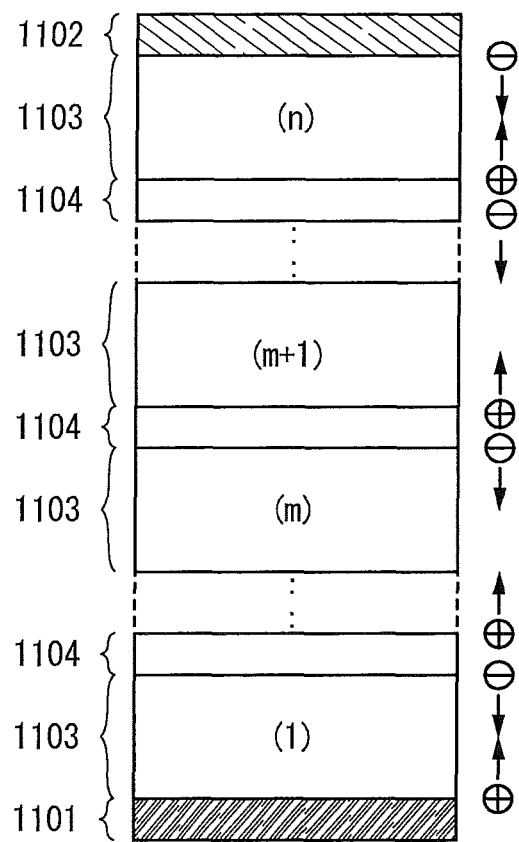

Another example of the structure of the light-emitting element is illustrated in FIG. 6A. In the light-emitting element exemplified in FIG. 6A, two EL layers are provided between the anode 1101 and the cathode 1102. Further, the intermediate layer 1104 is provided between an EL layer 1103a and an EL layer 1103b.

The number of the EL layers provided between the anode and the cathode is not limited to two. The light-emitting element exemplified in FIG. 6B has a structure in which a plurality of EL layers 1103 is stacked, that is, a stacked-layer element structure. Note that in the case where n EL layers 1103 are provided between the anode and the cathode (n is a natural number greater than or equal to 2), each intermediate layer 1104 is provided between an mth EL layer and an (m+1)th EL layer (m is a natural number greater than or equal to 1 and less than or equal to (n−1)).

For the EL layer 1103 in Example 3 of Light-Emitting Element Structure, the same structure as that in Example 1 of Light-Emitting Element Structure described above can be applied. As for the intermediate layer 1104 in Example 3 of Light-Emitting Element Structure, the same structure as that in Example 2 of Light-Emitting Element Structure described above can be applied. Therefore, the explanation in Example 1 or 2 of Light-Emitting Element Structure can be referred to for the details.

The behaviors of electrons and holes in the intermediate layer 1104 provided between the EL layers are described. When a voltage higher than the threshold voltage of the light-emitting element is applied between the anode 1101 and the cathode 1102, holes and electrons are generated in the intermediate layer 1104, and the holes move into the EL layer provided on the cathode 1102 side and the electrons move into the EL layer provided on the anode 1101 side. The holes injected into the EL layer provided on the cathode side recombine with the electrons injected from the cathode side, so that the light-emitting substance included in the EL layer emits light. Further, the electrons injected into the EL layer provided on the anode side recombine with the holes injected from the anode side, so that the light-emitting substance included in the EL layer emits light. Thus, the holes and electrons generated in the intermediate layer 1104 cause light emission in the different EL layers.

Note that the EL layers can be provided in contact with each other when these EL layers allow the same structure as the intermediate layer to be formed therebetween. The EL layers can be provided in contact with each other specifically when one of the contacting surfaces of the EL layers is provided with a charge generation region, because the charge generation region functions as a first charge generation region of the intermediate layer.

Examples 1 to 3 of Light-Emitting Element Structure can be implemented in combination. For example, an intermediate layer can also be provided between the cathode and the EL layer in Example 3 of Light-Emitting Element Structure.

[Embodiment 6]

In this embodiment, examples of a lighting device including a light-emitting module in accordance with one embodiment of the present invention are described with reference to FIGS. 7A and 7B.

In accordance with one embodiment of the present invention, a lighting device in which a light-emitting portion has a curved surface can also be realized.

One embodiment of the present invention can also be applied to a lighting device for motor vehicles; for example, a lighting device can also be easily mounted on a dashboard, a ceiling, or the like.

Figure 7A:
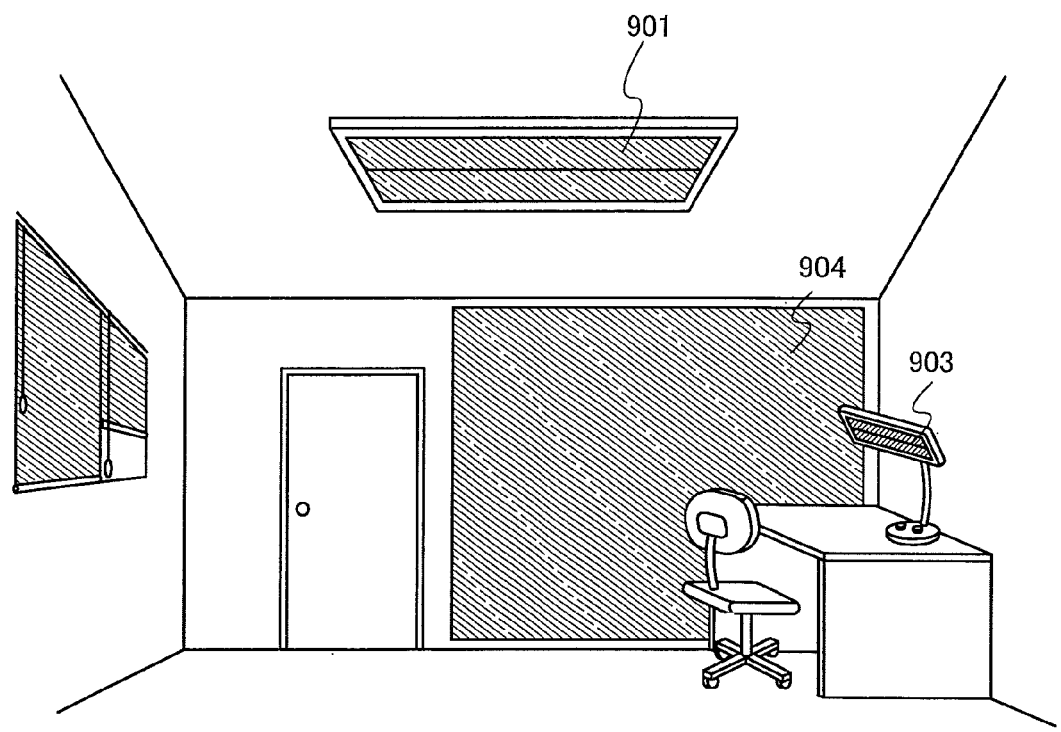
FIGS. 7A and 7B illustrate lighting devices each using a light-emitting device in accordance with one embodiment.

In FIG. 7A, a lighting device 901 provided on the ceiling in a room, a lighting device 904 provided on a wall, and a desk lamp 903, to which one embodiment of the present invention is applied, are illustrated. Since the light-emitting module in accordance with one embodiment of the present invention can have a larger area, it can be used for a lighting device having a large area.

Figure 7B:
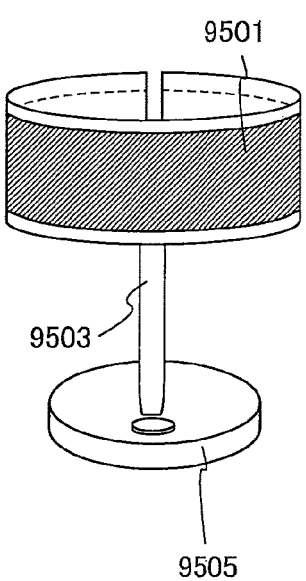

In FIG. 7B, an example of another lighting device is illustrated. A table lamp illustrated in FIG. 7B includes a lighting portion 9501, a support 9503, a support base 9505, and the like. The lighting portion 9501 includes the light-emitting module in accordance with one embodiment of the present invention. In one embodiment of the present invention, a lighting device having a curved surface can be thus realized.

This embodiment can be freely combined with any of the other embodiments.

This application is based on Japanese Patent Application Serial No. 2011-028914 filed with the Japan Patent Office on Feb. 14, 2011, the entire contents of which are hereby incorporated by reference.

What is claimed is:
1. A light-emitting module comprising:
a light-emitting element;
a positive temperature coefficient thermistor; and
a substrate between the light-emitting element and the positive temperature coefficient thermistor,
wherein the light-emitting element includes a first electrode, a layer including a light-emitting organic compound over the first electrode and a second electrode over the layer including the light-emitting organic compound,
wherein the positive temperature coefficient thermistor includes a third electrode,
wherein the light-emitting element and the positive temperature coefficient thermistor overlap each other, wherein the light-emitting element is configured to be supplied with electric power through the positive temperature coefficient thermistor, wherein the positive temperature coefficient thermistor is configured to interrupt or inhibit supply of the electric power to the light-emitting element, wherein the substrate comprises an opening, and wherein the first electrode of the light-emitting element is electrically connected to the third electrode of the positive temperature coefficient thermistor through the opening of the substrate.

2. The light-emitting module according to claim 1, wherein an operation temperature of the positive temperature coefficient thermistor is greater than or equal to 100° C. and less than or equal to 200° C.

3. The light-emitting module according to claim 2, wherein the positive temperature coefficient thermistor comprises a material in which electrically conductive filler is dispersed in a polymer positive temperature coefficient material or a material in which a rare earth element is added to barium titanate.

4. The light-emitting module according to claim 1, wherein the light-emitting element is thermally coupled with the positive temperature coefficient thermistor through an electrically conductive material.

5. The light-emitting module according to claim 1, wherein the light-emitting element is located over the positive temperature coefficient thermistor, and wherein light emitted by the layer including the light-emitting organic compound is extracted through the second electrode.

6. The light-emitting module according to claim 1, wherein the light-emitting module is incorporated into a lighting device.

7. The light-emitting module according to claim 1, wherein the positive temperature coefficient thermistor is configured to interrupt or inhibit supply of the electric power to the light-emitting element when the positive temperature coefficient thermistor detects a temperature higher than an operation temperature of the positive temperature coefficient thermistor.

8. The light-emitting module according to claim 1, further comprising an insulating layer between the light-emitting element and the positive temperature coefficient thermistor.

9. A light-emitting module comprising:
a light-emitting element;
a first positive temperature coefficient thermistor;
a second positive temperature coefficient thermistor electrically directly connected in series to the first positive temperature coefficient thermistor; and
a substrate between the light-emitting element and each of the first positive temperature coefficient thermistor and the second positive temperature coefficient thermistor, wherein the light-emitting element includes a first electrode, a layer including a light-emitting organic compound over the first electrode and a second electrode over the layer including the light-emitting organic compound, wherein each of the first positive temperature coefficient thermistor and the second positive temperature coefficient thermistor includes a third electrode, wherein the light-emitting element overlaps with each of the first positive temperature coefficient thermistor and the second positive temperature coefficient thermistor, wherein the light-emitting element is configured to be supplied with electric power through the first positive temperature coefficient thermistor and the second positive temperature coefficient thermistor, wherein the first positive temperature coefficient thermistor and the second positive temperature coefficient thermistor are configured to interrupt or inhibit supply of the electric power to the light-emitting element, wherein the substrate comprises an opening, and wherein the first electrode of the light-emitting element is electrically connected to the third electrode of each of the first positive temperature coefficient thermistor and the second positive temperature coefficient thermistor through the opening of the substrate.

10. The light-emitting module according to claim 9, wherein an operation temperature of each of the first positive temperature coefficient thermistor and the second positive temperature coefficient thermistor is greater than or equal to 100° C. and less than or equal to 200° C.

11. The light-emitting module according to claim 9, wherein the first positive temperature coefficient thermistor and the second positive temperature coefficient thermistor comprise a material in which electrically conductive filler is dispersed in a polymer positive temperature coefficient material or a material in which a rare earth element is added to barium titanate.

12. The light-emitting module according to claim 9, wherein the light-emitting element is thermally coupled with the first positive temperature coefficient thermistor and the second positive temperature coefficient thermistor through an electrically conductive material.

13. The light-emitting module according to claim 9, wherein the light-emitting element is located over the first positive temperature coefficient thermistor and the second positive temperature coefficient thermistor, and wherein light emitted by the layer including the light-emitting organic compound is extracted through the second electrode.

14. The light-emitting module according to claim 9, wherein the light-emitting module is incorporated into a lighting device.

15. The light-emitting module according to claim 9, wherein the first positive temperature coefficient thermistor and the second positive temperature coefficient thermistor are configured to interrupt or inhibit supply of the electric power to the light-emitting element when at least one of the first positive temperature coefficient thermistor and the second positive temperature coefficient thermistor detects a temperature higher than an operation temperature of the one of the first positive temperature coefficient thermistor and the second positive temperature coefficient thermistor.

16. The light-emitting module according to claim 9, further comprising an insulating layer,
wherein the insulating layer is between the light-emitting element and each of the first positive temperature coefficient thermistor and the second positive temperature coefficient thermistor.

* * * * *

UNITED STATES PATENT AND TRADEMARK OFFICE
CERTIFICATE OF CORRECTION

PATENT NO. : 9,735,209 B2  
APPLICATION NO. : 14/713803  
DATED : August 15, 2017  
INVENTOR(S) : Hiroki et al.

Page 1 of 1

It is certified that error appears in the above-identified patent and that said Letters Patent is hereby corrected as shown below:

In the Claims

Column 21, Line 17, Claim 3; Change "claim 2," to --claim 1,--.

Signed and Sealed this
Fourteenth Day of November, 2017

Joseph Matal
*Performing the Functions and Duties of the
Under Secretary of Commerce for Intellectual Property and
Director of the United States Patent and Trademark Office*